(12) United States Patent
Martinent et al.

(10) Patent No.: US 8,359,729 B2
(45) Date of Patent: Jan. 29, 2013

(54) METHOD FOR PRODUCING A DEVICE COMPRISING A TRANSPONDER ANTENNA CONNECTED TO CONTACT PADS IN WHICH SOLDERING ENERGY IS APPLIED DIRECTLY TO CONTACT PADS

(75) Inventors: Jean-François Martinent, La Ciotat (FR); Laurence Robles, Saint Zacharie (FR); François Roussel, Roquefort la Bedoule (FR)

(73) Assignee: Gemalto SA, Gemenos (FR)

( * ) Notice: Subject to any disclaimer, the term of this patent is extended or adjusted under 35 U.S.C. 154(b) by 434 days.

(21) Appl. No.: 12/600,483

(22) PCT Filed: May 13, 2008

(86) PCT No.: PCT/EP2008/055859
§ 371 (c)(1),
(2), (4) Date: Nov. 17, 2009

(87) PCT Pub. No.: WO2008/141982
PCT Pub. Date: Nov. 27, 2008

(65) Prior Publication Data
US 2010/0147958 A1    Jun. 17, 2010

(30) Foreign Application Priority Data

May 21, 2007 (EP) .................................. 07301057

(51) Int. Cl.
*H02P 11/00* (2006.01)
(52) U.S. Cl. ............. 29/600; 29/592.1; 29/601; 29/832; 235/492

(58) Field of Classification Search ................. 29/592.1, 29/600, 601, 830–832; 343/700 MS, 853, 343/846; 235/492, 380–385
See application file for complete search history.

(56) References Cited

U.S. PATENT DOCUMENTS

| 5,528,222 | A |   | 6/1996  | Moskowitz et al. |
|-----------|---|---|---------|------------------|
| 5,598,032 | A | * | 1/1997  | Fidalgo ........................ 257/679 |
| 6,008,993 | A | * | 12/1999 | Kreft ............................. 361/737 |
| 6,088,230 | A | * | 7/2000  | Finn et al. ..................... 361/737 |

(Continued)

FOREIGN PATENT DOCUMENTS

| EP | 0880754 A2 | 12/1998 |
| EP | 0913268 A1 | 5/1999 |

(Continued)

OTHER PUBLICATIONS

International Search Report (PCT/ISA/210) for PCT/EP2008/055859 mailed Aug. 1, 2008.

(Continued)

*Primary Examiner* — Minh Trinh
(74) *Attorney, Agent, or Firm* — Buchanan Ingersoll & Rooney PC (57) ABSTRACT

A method for producing a device having a transponder antenna connected to contact pads. An antenna with terminal connections is provided in contact with a substrate. The contact pads are placed on the substrate and connected to the terminal sections of the antenna. The connection is produced by means of a soldering by introducing energy between the pads and the terminal sections. The pads are placed such as to provide a surface facing an antenna terminal connection section. The section is arranged on the substrate and the soldering energy is directly applied to the pads. The invention also relates to the device obtained.

14 Claims, 4 Drawing Sheets

U.S. PATENT DOCUMENTS

| | | |
|---|---|---|
| 6,233,818 B1 | 5/2001 | Finn et al. |
| 6,288,443 B1 * | 9/2001 | Finn et al. ..................... 257/678 |
| 6,677,186 B1 * | 1/2004 | Zafrany et al. ................ 438/125 |
| 6,957,481 B1 * | 10/2005 | Patrice ............................. 29/600 |
| 7,958,622 B1 * | 6/2011 | Ayala et al. ..................... 29/600 |
| 2010/0147958 A1 * | 6/2010 | Martinent et al. ............ 235/492 |

FOREIGN PATENT DOCUMENTS

| | | |
|---|---|---|
| EP | 1328899 A1 | 7/2003 |
| FR | 2782821 A | 3/2000 |
| JP | 2002-298110 A | 10/2002 |
| WO | WO 97/30418 A2 | 8/1997 |
| WO | WO 00/30210 A1 | 5/2000 |
| WO | WO 02/27651 A1 | 4/2002 |

OTHER PUBLICATIONS

Written Opinion (PCT/ISA/237) for PCT/EP2008/055859 mailed Aug. 1, 2008.

* cited by examiner

METHOD FOR PRODUCING A DEVICE COMPRISING A TRANSPONDER ANTENNA CONNECTED TO CONTACT PADS IN WHICH SOLDERING ENERGY IS APPLIED DIRECTLY TO CONTACT PADS

The invention more particularly relates to the field of radio frequency transponders. In particular, it relates to a method for producing a device including a transponder antenna connected to contact pads and the device obtained.

The above method more particularly includes a step of connecting the antenna to contact pads, the latter being possibly connected to a microcircuit such as an electronic chip or a module.

The invention aims at being used mainly in the process of the production of a low cost and low thickness radio frequency electronic inlay preferably having good communication properties, more particularly as regards the range.

Such an inlay includes at least an antenna on a substrate connected to a microcircuit; it is more particularly intended to be inserted into a sheet lamination, the cover of an electronic passport, an identification card or any product provided with the radio frequency communication section; and thus the thickness thereof is very important.

Among various connection techniques, the most currently used is known which consists of a wire bonding type connection, a wire soldering using an ultrasonic probe which feeds and solders a connection wire between the various points to be connected, the chip or a component being positioned close to the ends of the antenna to be connected.

This technique has the drawback of requiring flat connection metallic surfaces, more particularly engraved, and a support of surfaces resisting the pressure of a soldering tool, a protection resin on the connections, so as to protect the same and a sheet for compensating the thickness of the resin.

In another solution, the connection is provided by a conductive adhesive material positioned between the ends of the antenna and the connections of a component, a module or a chip being placed directly on the connection ends of an antenna, for example made of copper and engraved on a substrate.

The utilisation of a conductive adhesive material has the drawback of requiring metallic tracks or windings which are stripped and the intersection of the windings requires double face etchings or a step of production of an isolating bridge.

A method of production of an antenna connected by a sewing stitch is known from the application for a patent JP 2002 298110 A, wherein a module is first fixed on a substrate and the antenna is subsequently fixed by sewing stitches on the substrate; and as for the connection of the modules to the antenna, the wire extends above the pads and clamps by contact the contact pads on the module.

As an alternative, the connection can be provided by a thermo-compression of the antenna wire on the contact pads, with the probe pressing and bringing thermal energy directly onto the wire.

In other cases, such as in patent EP 0880 754 B1, the antenna wire made of a wire inlaid into a polymer sheet, lies above the contact pads of a chip which is already positioned or the corresponding position thereof, prior to a connection by, more particularly, an ultrasonic or a thermo-compression soldering directly by pressing and bringing energy directly onto the wire.

When it is necessary to go beyond connection pads positions, the substrate is provided with a cavity for receiving an electronic chip or a module. During the production, the inlaying tool stops the inlaying before the cavity, goes beyond the cavity and fixes the wire again after the cavity; then, the chip or a module is introduced from under the cavity so that the pads of the chip are facing the wires prior to making the connection by soldering.

This method has the drawback of being time-consuming and requiring a cavity prior to the production of the antenna.

Thus, as regards the presence of the module on the substrate prior to the production of the antenna, it can be an obstacle to the mass production rate of the antenna for some antenna embodiments.

In the patent EP 1328899 B1, the antenna is produced using a metallic wire sewn onto a sheet and contact dies are previously positioned on the sheet and sewn with the antenna wire. A chip is placed on the substrate and more particularly connected by a link with a "wire bonding" soldered to the dies. This technique requires the prior positioning of the pellets and subsequent coating of the connections as mentioned above.

The invention aims at solving the above-mentioned drawbacks of the connection of a microcircuit to an antenna, more particularly within the scope of the production of a low thickness and low cost radio frequency electronic inlay and ensuring having correct properties of communication, more particularly as regards the range.

For this purpose, the invention aims at a method for producing a device including a transponder antenna connected to contact pads, said method including the following steps:

production of an antenna comprising connection terminal sections resting on a substrate, placing contact pads on the substrate and the connection thereof to the antenna terminal sections, with the connection being carried out as a soldering by introduction of energy between the pads and the terminal sections;

The method is characterised in that the pads are placed in such a way as to have a surface facing an antenna connection terminal section, said section being positioned on the substrate, the soldering energy being directly applied to the pads.

In addition to solving the above-mentioned drawbacks, the invention gives flexibility to the production of the device, thanks to the separation of the production of the antenna from the other conventional inlay production operations, more particularly the previous positioning of the contact pads on a substrate, the prior production of a cavity under the antenna connection sections, the coating of the connections and preventing the soldering tool from being polluted.

According to various characteristics of the implementation, the method is characterised:

in that the antenna is produced by embroidery or sewing on a flexible support including a fabric and in that it includes a step during which a reinforcing material is positioned more particularly as a sheet or a layer on a face of the substrate opposite the one carrying the terminal sections;

the reinforcing layer or sheet is positioned after the production of the antenna;

the method includes a step of forming a cavity in the substrate and/or the reinforcing sheet or layer close to the antenna connection terminal sections;

the method includes a step during which contact pads associated with a microcircuit are positioned facing the antenna terminal sections, the microcircuit being inserted at least partly into the cavity;

the method includes a step according to which a soldering of the thermo-compression or ultrasonic type is carried out;

the soldering uses an anvil which rests against the recess of the antenna terminal section in the support;

the anvil goes through at least the reinforcing sheet or layer facing the connection terminal section so that the connection section is supported by the anvil during the soldering;

the antenna wire is a hybrid wire associated at least with a non conductive wire;

Another object of the invention is a device including an antenna connected to contact pads, said device including a substrate and an antenna provided with connection terminal sections resting on the substrate, with said antenna being connected by soldering to the terminal sections.

The device is characterised in that the electric contact pads have a surface facing an antenna connection terminal section with said section being positioned onto the substrate.

According to other characteristics of the device:

the antenna is produced by embroidery or sewing on a flexible support including a fabric and it includes a reinforcing material as a sheet or a layer on one face of the substrate opposite the one supporting the terminal sections;

the device includes a cavity in the substrate and/or reinforcing sheet or layer close to the antenna connection terminal sections;

contact pads are associated with a microcircuit and positioned opposite the substrate and the antenna terminal sections resting on the substrate, whereas the microcircuit is inserted at least partially into the cavity;

the pads include a soldering mark across the pads on one face of the pads opposite the soldered one;

the device includes perforations in the reinforcing material opposite each connected terminal section;

the antenna wire is a hybrid wire associated with at least one non conductive wire.

Another object of the present invention is a radio frequency communication product such as a contactless chip card, a passport including the mentioned device or obtained according to the above-mentioned method.

Other characteristics and advantages of the invention will appear while reading the following description given as an illustrative and in no way limitative example, and given more particularly while referring to the appended drawings wherein.

Figure 1:
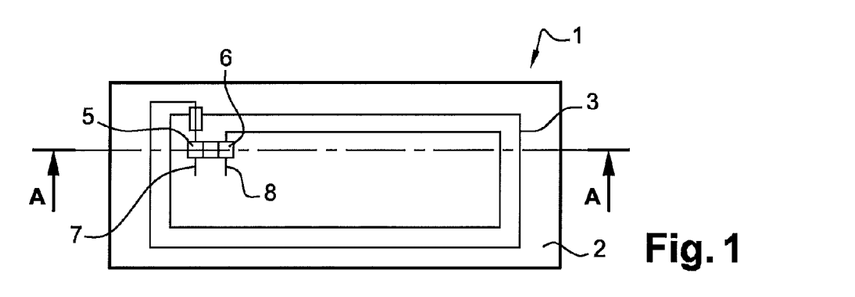
FIG. 1 illustrates a schematic view of a transponder which can be obtained according to one embodiment of the method of the invention.

FIG. 1 illustrates a schematic view of a device 1 including an antenna 3 connected to contact pads 5, 6 which can be obtained according to one embodiment of the method of the invention.

The device includes a substrate 2 and an antenna provided with connection terminal sections 7, 8 resting on the substrate. The antenna is connected to the terminal sections by soldering (S). The antenna is produced by electrochemical etching. The tracks are thin with respect to the pads, for example 2 mm in width/5 mm. The module may include or not a support dielectric film.

Preferably, the metallic contact surfaces 11 on which a soldering tool T (thermode) has been applied (FIG. 2) have no material which could pollute the soldering tool.

Figure 2:
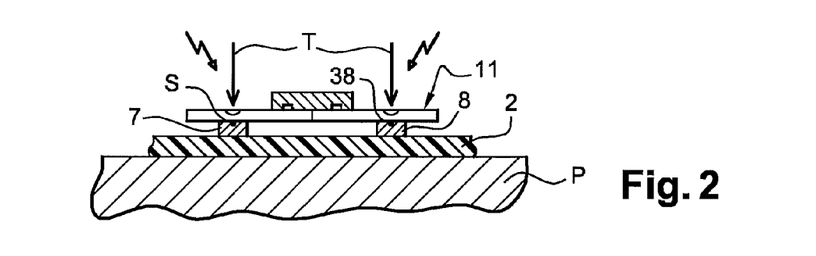
FIG. 2 illustrates in greater details the electronic circuit module of FIG. 1, being connected to the antenna.

According to one embodiment of the invention in FIG. 2, contrary to the prior art wherein connection sections lie above already positioned pads or are placed above a chip or a module recess, here the electric contact pads have a surface opposite an antenna connection terminal section which rests on the substrate 2. The pads rest on and in contact with the ends 7, 8 of the antenna during a connection operation with a device 1 resting on a plane P.

Mainly in the prior art, the chip connections with etched antennas are produced with conductive or non conductive glue, but with pads on the chip, the latter being placed on the antenna, or through soldered wires, with the chip being positioned above the same.

Figure 3:
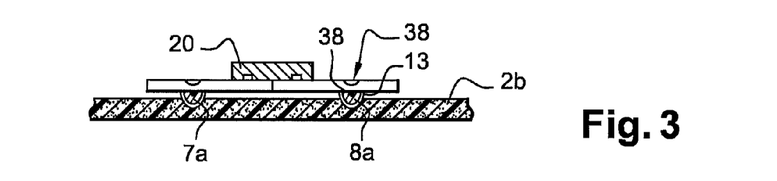
FIG. 3 illustrates a sectional view of a second embodiment, with the antenna being made of an incrusted wire.

In FIG. 3, with the same configuration for placing the pads or the module as in FIG. 2, the antenna is produced by inlaying the conductive wire into a polymer sheet $2b$. The conductive wire may be coated with a varnish or an isolating sheath 13.

Figure 4:
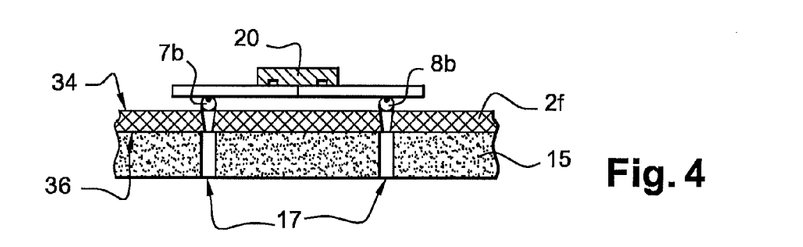
FIG. 4 illustrates a sectional view of a third embodiment wherein the behaviour of the substrate is reinforced with a sheet.

In FIG. 4, still with the same placing configuration, the antenna is produced by embroidery or sewing on a flexible support including a fabric $2f$. The support is flexible insofar as it has no behaviour or rigidity as all low thickness fabrics. The loose meshing (m) between warp and weft wires is, for example, between 200 μm and 300 μm in both directions, with a 80 μm thick or 48 dtex polyamide wire. In addition, the fabric $2f$ is not stable as regards its dimensions insofar as it can normally be stretched manually and more particularly in diagonal, for example by at least 3% to 20%. This extension is lower than 1% in the substrate warp or weft feeding direction with a feeding tension during the production.

The handling of the supporting fabric of an embroidered antenna is very delicate (flexible and porous woven material), and so it is provided to stabilise it with a reinforcing material 15 in the form a sheet or a layer positioned on one face of the substrate opposite the one carrying the antenna terminal sections. The stabilising material 15 is fixed by adding a porous plastic sheet such as the one known under the trademark Teslin or synthetic paper.

Preferably, the addition of the reinforcing sheet is carried out after the production of the antenna so as not to be an obstacle for the production rates of embroidered antennas, but it could be carried out beforehand possibly with less interesting rates and a risk of deterioration of the needles on the embroidery or sewing frame.

An effect similar to the addition of a sheet can be obtained by impregnating or coating a layer or spraying a product such as a coating, a primer, a resin, polymer foam, a gum able to stabilise the substrate as regards its dimension.

The assembly can be carried out by lamination, thermo-soldering (melting of materials) or addition of an adhesive (as a film or a liquid), with the substrate being very low in thickness for productivity and easy implementation.

This step also makes it possible to give a higher thickness to the substrate to enable the reception of at least a part of a component into the support during the placing of the latter.

The device includes perforations 17, which may partially be closed, in the reinforcing material opposite each connection and terminal section 7b, 8b connected as results from the utilisation of a very low thickness anvil or needle applied under the conductive wire to be connected and which perforates the material as subsequently explained.

Figure 5:
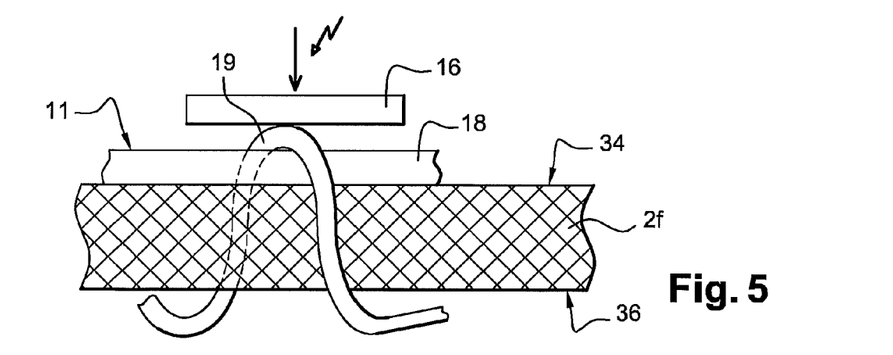
FIG. 5 illustrates a sectional view of a fourth embodiment showing a connection with an embroidered antenna wire.

In FIG. 5, a single pad 16, not yet connected to the microcircuit, is placed on an embroidered wire antenna terminal section 18 with an embroidery wire 19 for fixing the antenna on the fibrous support 2f. The connection of a microcircuit 20 to the pad can be carried out subsequently by any known means and more particularly using a flip-chip.

Figure 6:
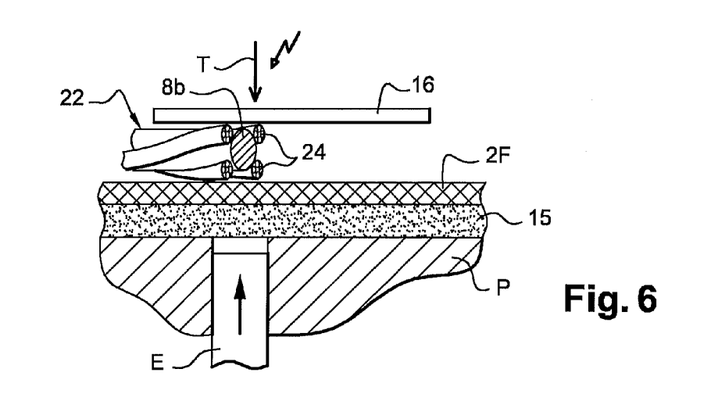
FIG. 6 illustrates a cross-sectional view of a fifth embodiment showing a connection with a hybrid antenna wire.
Figure 7:
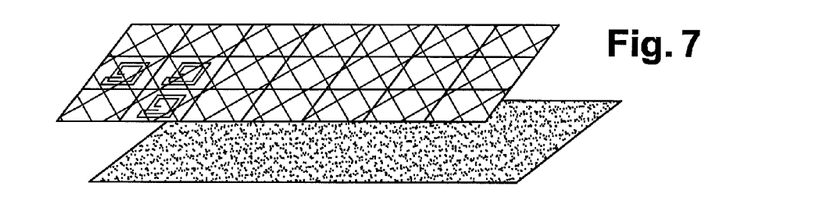
FIG. 7 illustrates a step of lamination of a reinforcing sheet in a support including a plurality of antennas.

In FIG. 6, a fifth embodiment of the device includes a connection with a hybrid antenna wire 22 insofar as the antenna wire 3 is associated with four non conductive wires 24; the association may however be made with at least one non conductive wire 24. The non conductive wires 24 are preferably thermo-fusible or thermo-plastic, so that they melt under the effect of a thermal or ultrasonic energy.

Because of the presence of the non conductive wires 19 and 24 according to the invention, the tool (thermode) (T) is applied onto the metallic pad 16, which results in melting the fixing wire and/or associated wire going thereunder without polluting the soldering tool. Preferably, an anvil is supporting the antenna wire during the connection.

Figure 8:
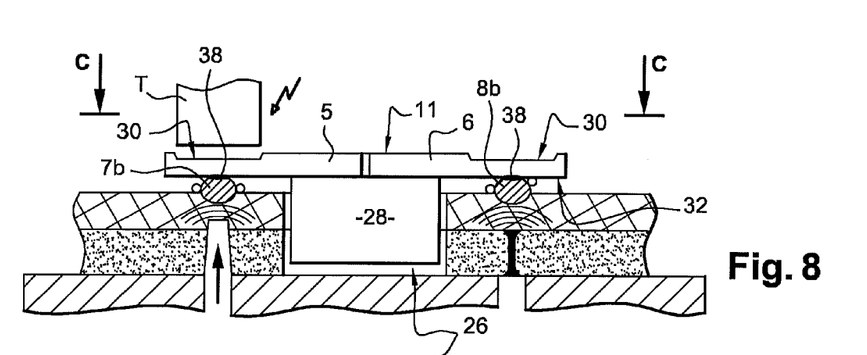
FIGS. 8 and 9 illustrate the prints left by the soldering tools and the anvil on the device complying with FIG. 4.
Figure 9:
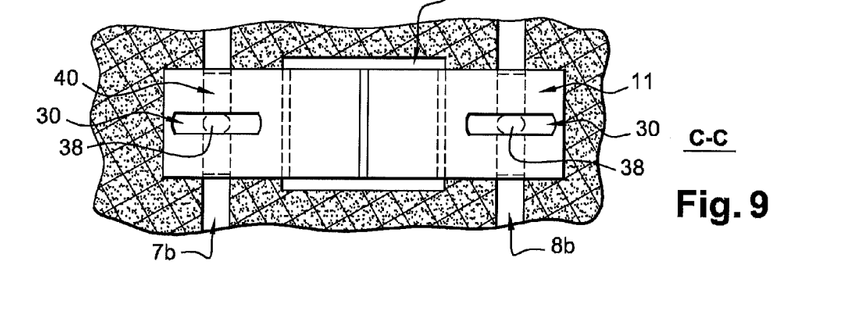

In FIGS. 8 and 9, the device includes a cavity 26 provided in the substrate and/or reinforcing sheet or layer close the antenna connection terminal sections. The contact pads 5, 6 are associated with a coated microcircuit 28. The microcircuit is inserted at least partially into the cavity thus reducing the total thickness of the device.

As can be seen, the pads 5, 6 include a mark 30 made by the soldering tool T and the soldering 38 carried out through the pads 5, 6 on one face 11 of the pads opposite the one 32 soldered to the wire.

Figure 10:
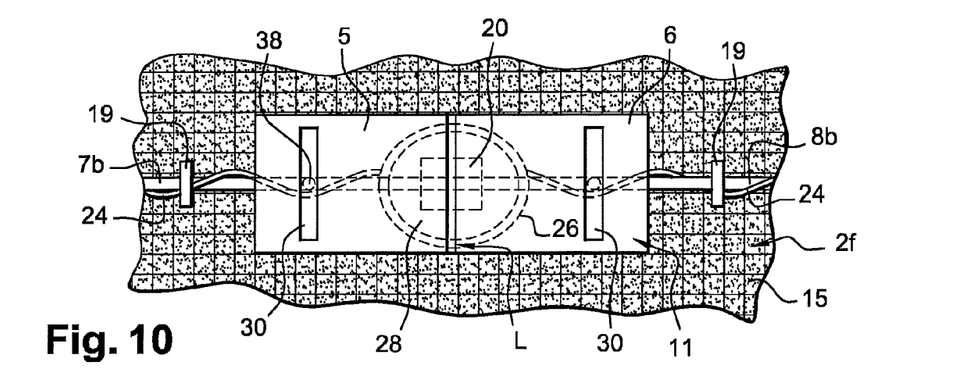
FIG. 10 illustrates another print, with another orientation, of the connection terminal section with respect to the module and soldering tool and the prints obtained.

FIG. 10 shows another configuration of the antenna wires 7a, 7b with respect to the contact pads 5, 6. The ends come face to face towards the chip. The application of the connection tool T is made transversally to the wire and to the pads and thus two corresponding marks 30 result on the top of the pads (free face 11). The marks are parallel to each other and parallel to a line L separating the pads 5 and 6.

Figure 11:
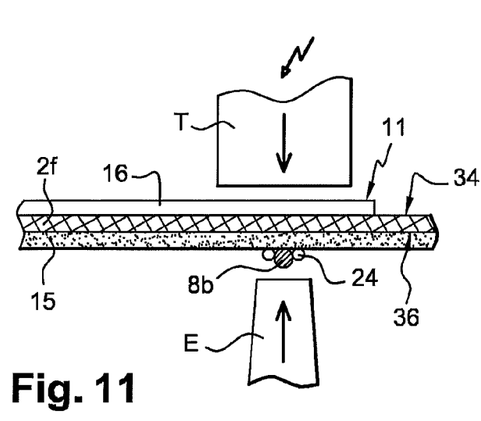
FIGS. 11 and 12 illustrate another configuration of the pads opposite the antenna wire and the connections thereof.
Figure 12:
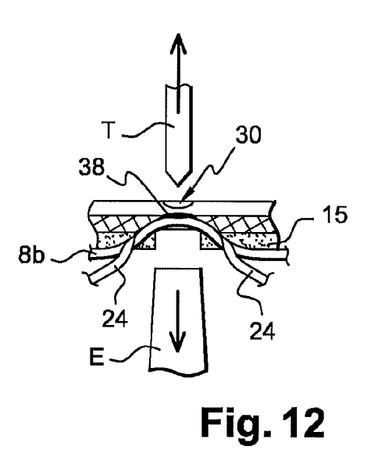

In FIGS. 11 and 12, another configuration of the device is such that the antenna wire 8b is positioned in line with the pad but on the face of the support 15 or even 2f (if the fabric can be handled) opposite the one supporting the contact pad 16. In this case, the very low thickness anvil E pushes the antenna wire against the contact pad through the support while fluxing the material 15 on the support and/or pushing away the meshes of the fibrous support 2f associated or not with a reinforcing material 15.

Figure 13:
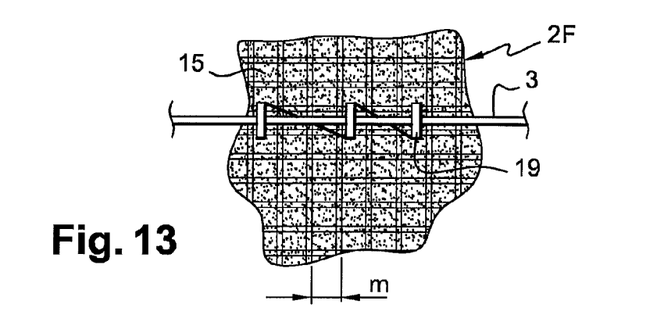
FIG. 13 illustrates a woven support supporting an antenna wire fixed by an embroidery wire.

In FIG. 13, a fabric includes warp and weft wires with a loose meshing (m) between 200 µm and 300 µm and composed of 48 dtex polyamide wires.

Figure 14:
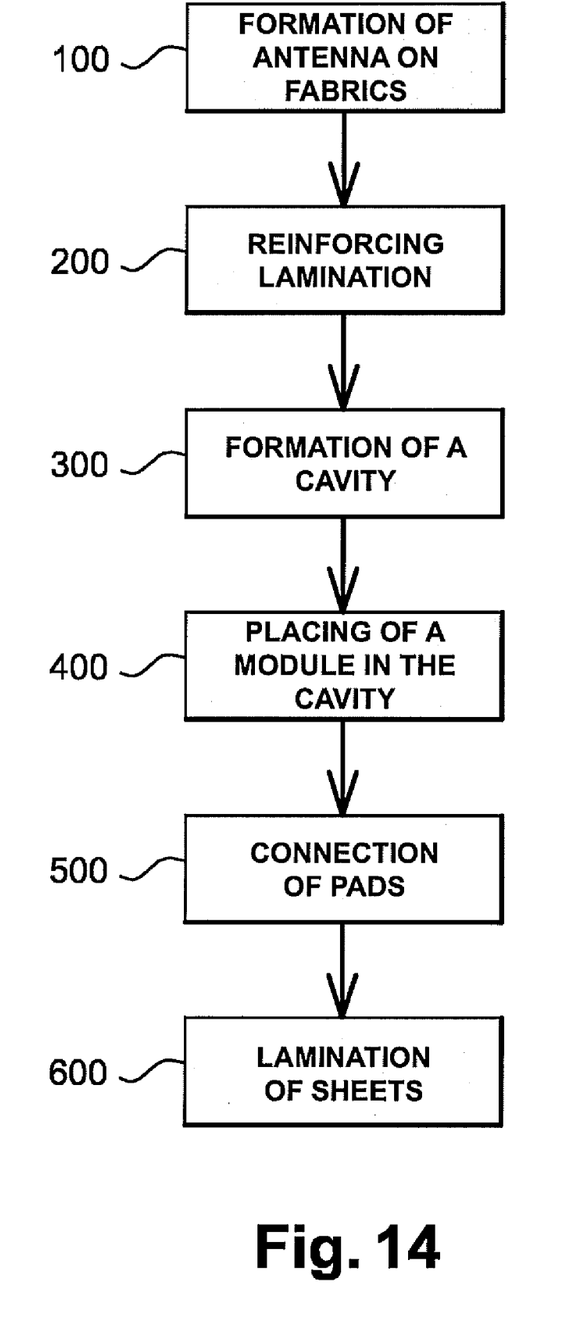
FIG. 14 illustrates the steps of the method according to the preferred embodiment.

While referring to FIG. 14, a preferred embodiment of the method of the invention will now be described which meets the aims of the invention, but while describing, first, the difficulties met.

To produce low cost inlays, the inventors more particularly selected wiring antennas for example sewn, embroidered or equivalents on the support including fabrics.

More particularly, in embroidery, because of problems of productivity and easy implementation, several antennas are first produced at the same time on embroidery frames, preferably on a textile support such as a fibrous support like a fabric, woven, non woven or a support which can be accepted by embroidery or sewing machines.

However, any material capable of being sewn or embroidered and for example including other isolating substrates such as a film or a sheet made of polymer material, PVC, PET (polyethylene), paper, polyimide, synthetic leather and more particularly fibrous/fabric and polymer sheet composites, are not excluded.

As regards the discretion of the device, subsequently laminated or added to an object, but also because of productivity and ease of sewing or embroidery, the support is a very fine fabric. The substrate of the final device may have various thicknesses generally lower than or equal to those of a 0.76 mm chip card, so that they can be used as an inlay between two films or sheets or be used as a support for a coating and/or a printing sheet. Typically, the substrate may have a thickness from for example 0.1 mm to 0.5 mm.

The inventors noted the absence of stability as regards dimension or behaviour of some substrates more particularly made of fabric, which are appropriate for a mass production, more particularly when they are continuous or moving. The absence of behaviour makes it difficult or impossible to obtain a precise positioning of the modules, microcircuits or contact pads or cavities more particularly by an indexation on the substrate prior to or after the production of antennas.

Adding a reinforcing sheet or material or another fabric to the substrate, with possibly predefined modules reception cavities such as imagined by the inventors, would bring dimensional stability to the substrate but also has drawbacks, because of the absence of behaviour of the substrate and a difficult indexation, the cavities might be incorrectly positioned.

Adding a sheet prior to making the antenna is not favourable for productivity in embroidery. On the contrary, adding this reinforcement without any cavity will bring a dimension of stability to the substrate, but this would increase the difficulty of a ultrasonic or thermo-compression connection insofar as there is no cavity for introducing a chip or a module and bringing the contact pads of the antenna connection sections closer to each other and make a correct soldering.

The inventors found out that the electronic component or contact pads must preferably be placed on the substrate after the antenna is produced to facilitate the sewing of the antenna to increase the production rate and because of the difficulty of placing and connecting the module, which make it possible to produce an economical antenna.

In addition, the antenna can be sheathed with an isolating material, more particularly to make an isolating bridge which intersect the windings or which can be associated with non conductive wires or fibres for solidity reasons or for preventing the breaking of the wire, or for fixing it on the support. In this case, the soldering tool can be polluted or soiled during the connection for the ultrasonic or thermo-compression soldering since the soldering tool (thermode) is directly applied to the wire and is in contact with polluting materials surrounding the antenna wire in a configuration wherein the module is positioned adjacent to the windings of the antenna or below the same.

In addition, as the wire antenna rests on the substrate and thus the inventors chose a position and a connection of the pads above the antenna, the latter may tend to sink into the sheet or fibrous mass added under the effect of pressure of the soldering means according to the nature of the material used.

After such considerations, the method of the figure is composed as follows.

At step 100, the method for producing a device including a transponder antenna connected to contact pads includes a step of providing or making an antenna with connection terminal sections supported by a substrate.

The antenna is preferably produced by embroidery or sewing on a flexible support including a fabric.

The antenna wire may include at least an isolation coating on the whole of its surface. It can also simultaneously or alternatively be in contact with isolating wires in places. The antenna wire is fixed on the substrate using a non conductive wire also called an embroidery or sewing wire.

Preferably, the antenna wire is a hybrid wire associated with at least one non conductive wire so as to enable a better rate of productivity without the wire breaking.

This non conductive wire surrounds the antenna wire at least in places and constitutes a kind of isolating sheath in places.

Preferably, a non conductive wire is thermo-fusible or thermo-plastic to enable the removal or elimination thereof around the soldering zone.

Non thermo-fusible wires may be appropriate insofar as the energy of the soldering is sufficient to remove the same, to deteriorate the same (or a sufficient soldering material is added to go through the same).

However, other techniques for fixing the conductive wire on the substrate may be chosen among other less efficient ones such as inlay or etching.

The production of the antenna by embroidery may preferably include a step of producing a barring stitch (not shown) of the antenna wire by sewing, embroidery, knitting at the end of one at least of said terminal sections. Then preferably, a step of removing said barring stitch including the removal of material from the support opposite the barring stitch and possible formation of a cavity. The antenna terminal sections or barring stitches may be superimposed or produced in a zone of the support intended to be removed. In case of removal of a barring stitch by punching, the corresponding terminal section extends up to the edge of a cavity.

As previously mentioned, the support is preferably a very low thickness fabric but other low thickness supports can be considered.

At step 200, then according to one characteristic, the method includes a step during which a reinforcing material is positioned as a sheet or a layer on one face of the substrate opposite the one supporting the terminal sections.

The reinforcing layer or sheet is positioned in the example, directly after the production of the antenna.

As already mentioned, an effect similar to the addition of a sheet can be obtained by impregnation or coating of a layer or spraying of a product such as a coating, a primer, a resin, a polymer foam, a gum capable of stabilising the substrate as regards its dimensions.

At step 300, as the support is stabilised, it possible to handle it and to carry out more conventional operations such as more easily placing contact pads on the substrate.

However, according to another characteristic, it is preferred to execute a step of forming a cavity in the substrate and/or reinforcing sheet or layer close to the antenna connection terminal sections, so as to introduce the chip or the module.

The cavity is formed by punching, but a forming by pressure or embossing or any at least partial machining of the substrate could also be considered.

At step 400, the pads are placed so as to have a surface opposite an antenna connection terminal section resting on the substrate. If need be, a chip can be placed more particularly using the flip-chip technology on the pads or on the rear face of the substrate or on a contact pad for a conventional connection by any known means or even with a soldered wire type.

The opposite surface used in the description corresponds to a projection of the longitudinal section of a wire on a connection pad 8b, or a rectangle the width of which is generally equal to the diameter of the wire and length of which is equal to the length of the pad opposite.

Preferably, the pads are already connected to an electronic microcircuit such as a chip. And the microcircuit is inserted at least partially into the cavity with the pads staying out of the cavity and resting on the sections of tracks or antenna terminal ends resting on the support.

A step 500 the pads are connected to the antenna terminal sections. The connection is made by soldering with the introduction of energy between the pads and the terminal sections and the soldering energy is directly applied onto the pads using a thermode for a thermo-compression type soldering or an ultrasonic probe for an ultrasonic soldering.

As regards soldering, an anvil is preferably used which rests against the recess of the antenna terminal section in the support. The anvil is all the more recommended as the antenna wire tends to sink into the substrate because of the fineness of the wire and/or softness of the substrate and/or reinforcing material.

The anvil goes through at least the reinforcing sheet or layer opposite the terminal section to be connected so that the section to be connected is supported by the anvil during the soldering operation. The section of the anvil is rectangular or square for a section of the order of $0.3 \times 1$ mm$^2$ to $1 \times 5$ mm$^2$.

The invention more particularly applies as soon as a kind of "blind" connection of a metal pad must be performed directly on a track of an antenna or the terminal section of an antenna, which is also metallic, and positioned on a softer support than metal by soldering with or without addition of a soldering material, the reverse being a conventional operation. A priori, during the soldering operation, the pressure transmitted by a track or a terminal section to the support thereof is more important than the one transmitted by a pad because of the surface and pressure ratio. This makes the persons skilled in the art decide for a connection configuration which is the reverse of the conventional one.

At step 600, the support is assembled with at least one sheet on the side opposite the reinforcing sheet. The sheets may for example be composed of materials used for the sheets or the cover of a passport or a chip card or any other object. Then they are cut to the desired format. If need be, the cutting may be carried out during other steps.

The invention claimed is:

1. A method for producing a device comprising an antenna connected to contact pads, said method comprising the steps of:
   providing or producing an antenna with terminal connections in contact with a substrate,
   placing the contact pads on the substrate and connecting the contact pads to the terminal sections of the antenna, the connection being produced by means of a soldering while introducing soldering energy between the contact pads and the terminal sections,
   wherein the contact pads are placed so as to provide a surface facing an antenna terminal connection section, said section being arranged on the substrate and the soldering energy being applied directly to the contact pads.

2. A method according to claim 1, wherein the step of providing or producing the antenna includes embroidering or sewing the antenna on a flexible support including a fabric, and the method further includes a step of positioning a reinforcing material in the form of a sheet or a layer on a face on the substrate opposite a face bearing the terminal sections.

3. A method according to claim 2, wherein the step of positioning the reinforcing material is after the step of providing or producing the antenna.

4. A method according to claim 2, wherein the method includes a step of forming a cavity in the substrate and/or reinforcing sheet or layer close to the antenna connection terminal sections.

5. A method according to claim 4, wherein the method includes a step of placing contact pads associated with a microcircuit facing the antenna terminal sections, the microcircuit being inserted at least partially into the cavity.

6. A method according to claim 1, wherein the method includes a step during which a soldering of the thermo-compression or ultrasonic type is executed.

7. A method according to claim 6, wherein the soldering utilises an anvil which rests against a recess in the antenna terminal section in the support.

8. A method according to claim 7, wherein the anvil goes creates a hole in the reinforcing sheet or layer facing the connection terminal sections so that the connection section is supported by the anvil during the soldering.

9. A method according to claim 1, wherein the antenna includes at least an isolating coating on the whole surface thereof and/or is in contact with isolating wires in places.

10. A method according to claim 1, wherein the step of providing or producing the antenna includes fixing the antenna on the substrate using a non conductive wire.

11. A method according to claim 10, wherein the non conductive wire surrounds the antenna wire at least in places.

12. A method according to claim 10, wherein the technique for fixing a conductive wire to the substrate is sewing, embroidery, or inlay.

13. A method according to claim 1, wherein the antenna comprises a hybrid wire including at least one non conductive wire.

14. A method according to claim 13, wherein the non conductive wire is thermo-fusible or thermoplastic.

* * * * *